United States Patent [19]
Nakamura et al.

[11] Patent Number: 4,511,821
[45] Date of Patent: Apr. 16, 1985

[54] SUPPORT STRUCTURE FOR PIEZOELECTRIC VIBRATOR

[75] Inventors: Takeshi Nakamura, Uji; Hiroshi Nishiyama, Muko; Satoshi Matsuda, Otokuni; Ikuo Matsumoto, Takatsuki, all of Japan

[73] Assignee: Murata Manufacturing Co., Ltd., Kyoto, Japan

[21] Appl. No.: 548,869

[22] Filed: Nov. 4, 1983

[30] Foreign Application Priority Data

Nov. 27, 1982 [JP] Japan ............................ 57-179564[U]

[51] Int. Cl.³ ............................................. H01L 41/08
[52] U.S. Cl. .................................... 310/354; 310/344; 310/351; 310/367
[58] Field of Search ................. 310/344, 348, 351–356, 310/321, 26, 367, 368

[56] References Cited

U.S. PATENT DOCUMENTS

| 2,123,236 | 7/1938 | Fair | 310/354 |
| 2,240,453 | 4/1941 | Wolfskill | 310/354 |
| 2,326,923 | 8/1943 | Bokovoy | 310/354 |

FOREIGN PATENT DOCUMENTS 295081  2/1928  United Kingdom ................ 310/354

Primary Examiner—Mark O. Budd
Attorney, Agent, or Firm—Wenderoth, Lind & Ponack

[57] ABSTRACT

A support structure for a vibrator comprising a casing having two sets of conical projections formed therein so as to confront each other, and a support framework supporting the vibrator at nodes of vibration thereof. The vibrator is supported within the casing with the support framework sandwiched between the tips of the respective projections of those two sets at the associated nodes of vibration of the support structure.

13 Claims, 3 Drawing Figures

SUPPORT STRUCTURE FOR PIEZOELECTRIC VIBRATOR

BACKGROUND OF THE INVENTION

The present invention generally relates to a support structure for supporting a vibrator on a support framework by means of paired coupling elements and, more particularly, to a vibrator support structure having a frequency of vibrations within the range of, for example, 50 to 200 KHz and suited for use in an FM multiplexer, a hand-held computer, a video tape recorder and the like.

Hitherto, this type of vibrator has been supported by a rectangular support framework by means of coupling elements connected thereto at nodes of vibration thereof, and the assembly has been then accommodated in a casing with four-sided peripheral edges of the support framework sandwiched between casing halves. In this support structure, the coupling elements are susceptible to torsional motion under the influence of vibrations of the vibrator. The torsional motion of the coupling elements tends to be transmitted to the casing through the support framework, causing the vibrations to leak exteriorly of the casing. Once this happens, the characteristic of the vibrator is adversely affected. In order to obviate this problem, as shown in FIG. 1 of the accompanying drawings, it is known to use a buffer member 5, made of an elastic material such as rubber, between each casing half of the casing 4 and the support framework 3 supporting the vibrator 1 through the coupling elements 2. However, this known support structure requires an increased members of component parts in view of the use of the buffer members 5 and renders the manufacture to be complicated and time-consuming. The result would be that not only is the manufacturing cost high, but also the automation of the manufacturing process and mass production are both difficult to practice. In addition, since the reduction of size of the buffer members is limited in order to save the high cushioning effect, so is the reduction in size of the support structure as a whole.

OBJECTS AND SUMMARY OF THE INVENTION

The present invention has been developed with a view to substantially eliminating the above described disadvantages inherent in the prior art support structures and has for its essential object to provide an improved support structure utilizing the minimized number of component parts and, therefore, making the manufacture simple and easy.

Another object of the present invention is to provide an improved support structure of the type referred to above, which makes it possible to manufacture the assembly in compact size on a mass production basis and, therefore, at a reduced manufacturing cost.

A further and important object of the present invention is to provide an improved support structure of the type referred to above, which is effective to eliminate the possibility of vibrations leaking exteriorly of the casing.

In order to accomplish these objects of the present invention, each of the casing halves is formed with a plurality of projections at respective locations corresponding in position to associated nodes of vibration of either the vibrator or the support framework. The vibrator is supported within the casing with either the vibrator or the support framework sandwiched between the tips of the respective projections in one of the casing halves and those in the other of the casing halves.

According to the present invention, since the casing is merely formed with the paired projections, not only can the number of component parts be minimized, but also the manufacture can be rendered easy and inexpensive and can also be carried out on a mass production basis. The structure as a whole can be reduced in size and, therefore, miniaturization can be attained conveniently. Moreover, since the fact that the vibrator is sandwiched between the paired projections integral with the respective casing halves, is nothing peculiar other than the support of the vibrator by the casing, the vibrator can be firmly supported by the casing and, therefore, the resistance to both vibration and impact can be increased. In addition, since the vibrator is supported at respective locations corresponding to nodes of vibration of either the vibrator or the support framework, and possible transmission of vibrations from the vibrator to the casing can be substantially completely cut off, and since no portion of the vibrator is exposed exteriorly of the casing, neither the transmission of vibrations from the vibrator direct to the exterior of the casing, nor the substantial leakage of vibration to the outside of the casing takes place, with the vibrating characteristic and other numerous characteristics being consequently stabilized.

BRIEF DESCRIPTION OF THE DRAWINGS

These and other objects and features of the present invention will become apparent from the following detailed description of a preferred embodiment thereof taken with reference to the accompanying drawings, in which.

DETAILED DESCRIPTION OF THE EMBODIMENT

Figure 1:
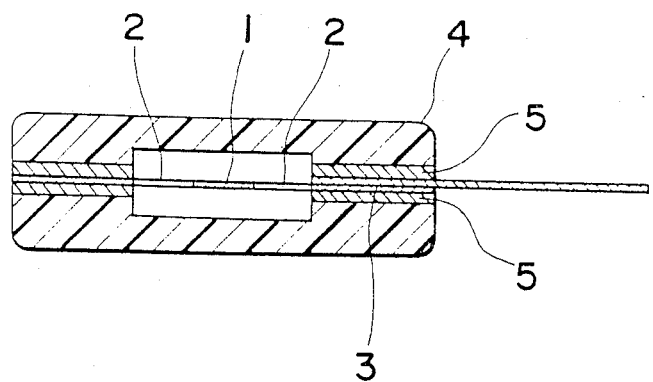
FIG. 1 is a side sectional view, showing the prior art vibrator support structure.

Before the description of the present invention proceeds, it is to be noted that like parts are designated by like reference numerals throughout the accompanying drawings except for FIG. 1 which has already been referred to.

Figure 2:
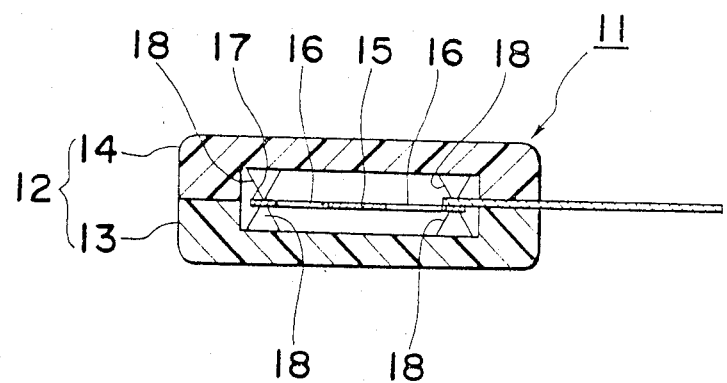
FIG. 2 is a view similar to FIG. 1, showing a vibrator support structure according to a preferred embodiment of the present invention.
Figure 3:
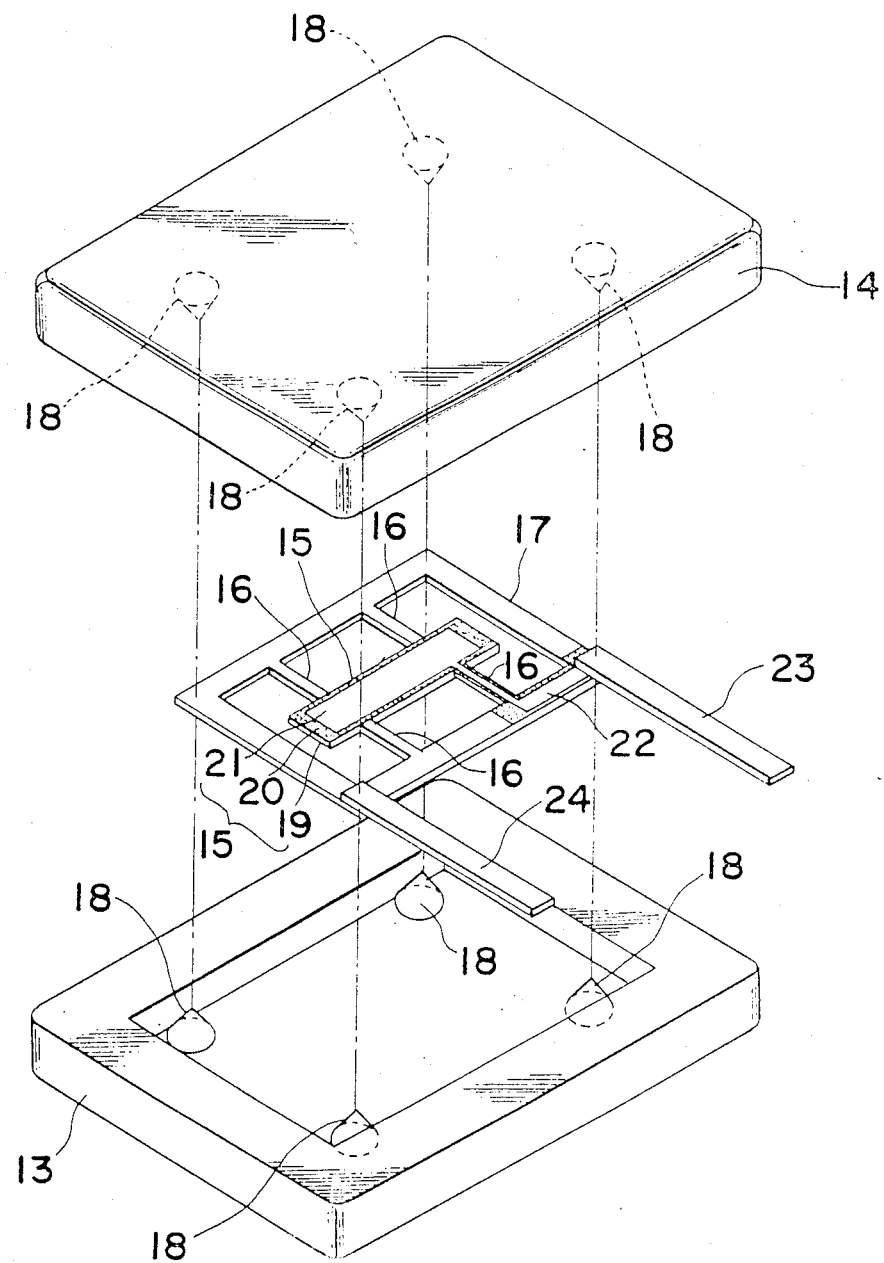
FIG. 3 is an exploded view on an enlarged scale, showing the support structure of FIG. 2.

Referring to FIGS. 2 and 3, a vibrator support structure 11 according to the illustrated embodiment includes a casing 12 made of an electrically insulating resin. This casing 12 is comprised of a casing body 13 and a lid 14 identical to casing body 13, and accommodates therein a support framework 17 supporting a vibrator 15, made of, for example, a piezoelectric element, at nodes of vibration thereof by means of two pairs of coupling elements 16. The framework 17 is rectangular in shape and is made up by four frames surrounding the vibrator 15. Each of the body 13 and lid 14 of the casing 12 is formed with a plurality of, for example, four in the illustrated embodiment, conical projections 18 at respective locations corresponding to the nodes of vibration of the vibrator 15 at which the vibration can be negligible, for example, those corresponding to the four corners of the framework 17 so far shown, the conical projections on the casing body 13 and those on the lid 14 being aligned with each other so that each corner of the framework 17 can come into alignment with and between the respective paired members of the conical projections 18 on the casing body 13 and the lid 14. The framework 17 is supported within the casing 12 with the four corners thereof sandwiched between the conical projections 18 on the casing body 13 and those on the lid 14. The vibrator 15 is supported within the casing 12 through this sandwich support system.

A vibrating element of the vibrator 15 is simultaneously integrally formed with connecting elements 16 and the framework 17 by etching off or blanking a thin plate of elastic invariable metal such as elinvar or by the use of any other technique. The vibrating element of the vibrator 15 has one surface coated with a piezoelectric layer 20 of, for example, zinc oxide. The deposition of the piezoelectric layer 20 can be carried out by the use of a sputtering technique or any other method. After the formation of the piezoelectric layer 20, an electrode 21 made of aluminum or any other good electroconductive material is formed so as to overlay the piezoelectric layer 20. In this way, the vibrator 15 is formed. The piezoelectric layer 20 is also formed so as to extend outwardly from the vibrating element of the vibrator 15 to one of the corners of the framework 17 through one of the connecting elements 16. A lead-out area 22 continuous with and extending outwards from the electrode 21 is deposited on the portion of the piezoelectric layer 20 formed on said one of the connecting element 16 and on said one of the corners of the framework 17.

A connecting terminal member 23 is either rigidly connected by soldering to the lead-out area 22 or held in contact therewith as sandwiched between the adjacent paired projections 18. Another one of the corners of the framwork 17 has another connecting terminal member 24 rigidly secured thereto by the use of, for example, a welding technique. Hereinafter, the manner by which the vibrator 15 of the construction described above is supported will be described.

In the first place, the framework 17 is placed on one of the casing body 13 and the lid 14 with its four corners resting on the conical projections 18 formed on such one of the body 13 and the lid 14 and, thereafter, the other of the body 13 and the lid 14 is mounted on the other of the body 13 and the lid 14 with its conical projections 18 aligned with the conical projections 18 on said one of the body 13 and the lid 14 and contacting the four corners of the framework 17 from the direction opposite to the direction in which the conical projections 18 on said one of the body 3 and the lid 14 contact the four corners of the framework 17. Then, while the casing body 13 and the lid 14 are pressed together by the application of external forces acting in opposite directions towards each other, the peripheral edge of one of the body 13 and the lid 14 is fusion-bonded with that of the other of the body 13 and the lid 14, thereby completing the fabrication. In the assembled condition, the casing 12 is hermetically sealed with both the support framework 17 and the vibrator 15 situated within the casing 12. At this time, the tips of the conical projections 18 are slightly deformed under the influence of a compressive force, but the tips being resilient, thanks to the forces exerted by the deformed tips of the conical projections 18 to restore to the original shapes, the vibrator 15 can be firmly sandwiched and supported. Thus, in the embodiment shown and described, the vibrator 15 contacts the casing 12 in a point-to-point contact fashion through the point support system including the paired projections 18 clamping the framework 17 from opposite directions, and therefore, any possible transmission of vibrations from the vibrator 15 direct to the casing 12 can substantially completely be cut off. In addition, since the terminal members 23 and 24 for the electric connection with an external circuit wirings are secured to the respective corners of the framework 17, that is, to the vibrator 15 at such respective locations where no vibration resulting from the possible torsional motion of the connecting elements 16 will not be transmitted, the possibility of the vibrations leaking to the outside of the casing 12 through the terminal members 23 and 24 can substantially be eliminated. Moreover, since the vibrator 15 is completely sealed within the casing, no direct transmission of the vibrations from the vibrator 15 to the exterior of the casing 12 takes place.

Although the present invention has fully been described in connection with the preferred embodiment with reference to the accompanying drawings, it is to be noted that various changes and modifications are apparent to those skilled in the art. By way of example, although in the foregoing embodiment each projection in each of the casing body and the lid has been described as contacting the corresponding node of vibration of the framework 17 in supporting the vibrator, it may contact the corresponding node of vibration of the vibrator. In addition, instead of the four point support system shown in and described with reference to FIGS. 2 and 3, the vibrator may be supported by the projections at two spaced nodes of vibration which are symmetric with respect to the center of the vibrator. Furthermore, although the projections on the casing body and the lid have been described and shown as having a conical shape, they may have a needle-like shape, a pyramid shape, or any other pointed shape, or in the form of a knife edge. In addition to a piezoelectric vibrator, the vibrator may also be any one of a electromagnetic vibrator and a quartz vibrator.

Accordingly, such changes and modifications are to be construed as included within the true scope of the present invention as defined by the appended claims unless they depart therefrom.

We claim:
1. A vibrator support structure, comprising:
a pair of identical confronting casing halves;
a pair of sets of projections having bases and tips deformable toward said bases, fixed at said bases to respective ones of said pairs of casing halves, the projections of each set being in confronting relation to respective corresponding projections of the other set;
a vibrator having at least two metallic conductors;
a support framework having paired connecting elements connecting to said vibrator at nodes of vibration thereof, supporting said vibrator through said connecting elements between said pair of casing halves, said framework supporting said at least two conductors on different portions thereof and having means for electrically insulating said at least two conductors from each other;
at least two metallic terminal members electrically connected with respective ones of said metallic conductors for external electrical connection, one of said vibrator and said support framework being sandwiched at the associated nodes of vibration thereof between said tips of said projections of said two sets of projections; and means for holding said pair of casing halves together with said terminal members clamped to said respective at least two conductors between said tips of some confronting projections of said sets of projections so as to electrically connect said conductors and said terminal members.

2. A structure as claimed in claim 1, wherein each of the projections of said pair of sets is a conical projection.

3. A vibrator support as in claim 1, wherein said some confronting projections consist of less than all of said projections, the tips of said some confronting projections being deformed toward the bases thereof more than the tips of the remainder of said projections.

4. A vibrator support as in claim 3, wherein said tips are elastically deformable.

5. A vibrator support as in claim 1, wherein said tips are elastically deformable.

6. A vibrator support as in claim 1, wherein said pair of casing halves and said sets of projections are formed of electrically insulative synthetic resin, said sets of projections being integrally formed with said respective ones of said pairs of casing halves, and said tips comprise acutely angled tips.

7. A vibrator support as in claim 6, wherein said acutely angled tips are cone-shaped.

8. A vibrator support as in claim 1, wherein said some confronting tips clamp said terminal members onto said different portions of said framework on said conductors.

9. A vibrator support as in claim 8, wherein said framework is a rectangular framework, said tips sandwiching said support framework, said terminal members and said conductors between said pair of casing halves at the four corners of said rectangular framework.

10. A vibrator support as in claim 1, wherein said framework includes outer frame members surrounding said vibrator and a plurality of coupling elements integrally coupling said frame members and said vibrator.

11. A vibrator support as in claim 10, wherein said vibrator includes a piezoelectric layer and an electrode layer overlaying said piezoelectric layer, said piezoelectric layer and said electrode layer having overlapping extended portions extending outwardly on one of said coupling elements to an outer end of said overlapping extended portions on said frame members, the extended portion of said electrode layer comprising one of said metallic conductors, said outer end of said overlapping extended portions being sandwiched between a confronting pair of said projections.

12. A vibrator support as in claim 11, wherein said framework has a rectangular shape so as to have four corners, said overlapping extended portions extending to one of said corners, said confronting projections sandwiching said support framework and said overlapping extended portions at said four corners.

13. A vibrator support as in claim 11, wherein said framework has a metallic conductor layer formed thereon electrically connecting said vibrator to one of said terminal members, another one of said terminal members being electrically insulated from said metallic layer by the extended portion of said piezoelectric layer.

* * * * *